United States Patent [19]
Hughes et al.

[11] Patent Number: 5,873,989
[45] Date of Patent: Feb. 23, 1999

[54] METHODS AND APPARATUS FOR LINEAR SCAN MAGNETRON SPUTTERING

[75] Inventors: John L. Hughes, Rodeo; Gary A. Davis, Fremont; Robert J. Kolenkow, Berkeley; Carl T. Petersen, Fremont; Norman H. Pond, Los Altos; Robert E. Weiss, San Francisco, all of Calif.

[73] Assignee: Intevac, Inc., Santa Clara, Calif.

[21] Appl. No.: 795,754

[22] Filed: Feb. 6, 1997

[51] Int. Cl.⁶ ................................................. C23C 14/34
[52] U.S. Cl. .............................. 204/298.2; 204/298.07; 204/298.09; 204/298.14; 204/298.19
[58] Field of Search ................ 204/298.07, 298.08, 204/298.09, 298.14, 298.19, 298.2

[56] References Cited

U.S. PATENT DOCUMENTS

| | | | |
|---|---|---|---|
| 4,395,323 | 7/1983 | Denton et al. | 204/298.14 X |
| 4,426,275 | 1/1984 | Meckel et al. | 204/298.14 X |
| 5,223,111 | 6/1993 | Lueft | 204/298.04 |
| 5,382,344 | 1/1995 | Hosokawa et al. | 204/298.2 |
| 5,427,665 | 6/1995 | Hartig et al. | 204/298.2 X |
| 5,433,835 | 7/1995 | Demaray et al. | 204/298.2 X |
| 5,536,380 | 7/1996 | Ocker et al. | 204/298.09 |
| 5,565,071 | 10/1996 | Demaray et al. | 204/192.12 |
| 5,616,225 | 4/1997 | Sieck et al. | 204/298.14 |
| 5,645,699 | 7/1997 | Sieck | 204/298.14 X |

FOREIGN PATENT DOCUMENTS

| | | | |
|---|---|---|---|
| 0820088A2 | 1/1998 | European Pat. Off. . | |
| 2707144 | 8/1977 | Germany | 204/298.2 |
| 63-22534A | 11/1994 | Japan | 204/298.2 |

OTHER PUBLICATIONS

R.F. Bunshah and others, "Deposition Technologies for Films and Coatings," Noyes Publications, 1982, pp. 230–237.

*Primary Examiner*—Nam Nguyen
*Attorney, Agent, or Firm*—Stanley Z. Cole

[57] ABSTRACT

A magnetron sputtering source for depositing a material onto a substrate includes a target from which the material is sputtered, a magnet assembly disposed in proximity to the target for confining a plasma at the surface of the target and a drive assembly for scanning the magnet assembly relative to the target. The sputtering source may further include an anode for maintaining substantially constant plasma characteristics as the magnet assembly is scanned relative to the target. The anode may be implemented as variable voltage stationary electrodes positioned at or near the opposite ends of the scan path followed by the magnet assembly, spaced-apart anode wires positioned between the target and the substrate or a movable anode that is scanned with the magnet assembly. The magnet elements of the magnet assembly may have different spacings from the surface of the target to enhance depositional thickness uniformity. The target may be fabricated in sections, each having a target element bonded to a backing element for reduced sensitivity to thermal variations. The target may be rotated from a first fixed position to a second fixed position relative to the magnet assembly at least once during its operating life for increased target utilization.

16 Claims, 12 Drawing Sheets

METHODS AND APPARATUS FOR LINEAR SCAN MAGNETRON SPUTTERING

FIELD OF THE INVENTION

This invention relates to deposition of sputtered films on substrates and, more particularly, to linear scan magnetron sputtering methods and apparatus which provide long target life and depositional thickness uniformity on large area substrates.

BACKGROUND OF THE INVENTION

Sputter deposition, also known as sputter coating, is a technique for depositing thin films of desired materials on a substrate such as, for example, a glass panel for a flat panel display, a magnetic disk for a hard disk drive or a semiconductor wafer. In general, ions of an inert gas from a plasma are accelerated toward a target of the material to be deposited. Free atoms of the target material are expelled when the ions collide with the target. A portion of the free atoms are collected on the surface of the substrate and form a thin film.

One well known sputtering technique is magnetron sputtering. Magnetron sputtering uses a magnetic field to concentrate the sputtering action. Magnets are positioned behind the target, and magnetic field lines penetrate the target and form arcs over its surface. The magnetic field helps to confine electrons in an area near the surface of the target. The resulting increased concentration of electrons produces a high density of ions and enhances the efficiency of the sputtering process.

Both fixed and movable magnet structures have been utilized in magnetron sputtering. In one prior art sputtering system utilizing a moving magnet, the target is circular and the magnet structure rotates with respect to the center of the target. In a second prior art sputtering system utilizing a moving magnet, the target is rectangular or square and the magnet structure is scanned along a linear path with respect to the target. In a third prior art sputtering system, the target is rectangular and the substrate is moved in a plane parallel to the surface of the target during sputtering. The second type of sputtering system is disclosed, for example, in U.S. Pat. No. 5,382,344 issued Jan. 17, 1995 to Hosokawa et al and U.S. Pat. No. 5,565,071 issued Oct. 15, 1996 to Demaray et al.

Prior art sputtering systems which utilize a rectangular or square target and a linearly scanned magnet structure have a number of problems and disadvantages. The requirement for large substrates has led to the need for large target assemblies. Such target assemblies usually include target tiles solder bonded to a single water-cooled backing plate. The bonded target tiles and the backing plate form a bimetal structure which bows permanently during the bonding operation in response to temperature variations because of differing rates of thermal expansion. Prior art attempts to minimize bowing have utilized target tile segments, expansion gaps between target tile segments, low melting point solder and backing plate materials that have a closer match in expansion/contraction coefficient with the target material. Bowing of the target can be significant, up to 0.060 inch for a 17 inch target using indium tin oxide tiles and a copper backing plate. Bowing of the target assembly produces variations in target-to-substrate distance and may compromise some other design parameter that is critical to the magnetron source operation.

A sputter cathode wherein target segments are mounted on a mounting plate by locating studs is disclosed in U.S. Pat. No. 5,536,380 issued Jul. 16, 1996 to Ocker et al. Each target segment includes a target backplate and a target bonded to the backplate.

Linear scan sputtering systems typically utilize a magnet assembly which produces a closed-loop plasma in the shape of an elongated oval, often referred to as a racetrack-shaped plasma. The magnet assembly is scanned with respect to the target in a direction perpendicular to the long dimension of the racetrack-shaped plasma. The resulting erosion of the target tends to be greatest at the ends of the plasma, thus producing erosion grooves along each edge of the target parallel to the scan direction. To avoid contaminating the substrate, sputtering must be stopped before the erosion pattern has consumed the full thickness of the target material at any point. The target must be replaced when the erosion at any point approaches a substantial fraction of the target's initial thickness. Thus, in a given production process, only a certain number of substrates can be coated from one target. By making the erosion of the target more uniform, a larger percentage of the target material may be utilized before it is necessary to replace the target.

The linear scanning sputter source typically has a large rectangular or square target attached to a water-cooled backing plate. This structure operates at cathode potential, typically several hundred volts negative with respect to ground. On the backing plate side of the target, a racetrack-shaped magnet assembly creates a magnetic field at the target surface that is sufficient to sustain a plasma when the appropriate electric field is provided. The electric field is created by operating the target structure at cathode potential in a chamber held at ground potential. The electric field at the target surface is influenced by the size and shape of the chamber and by the characteristics of the plasma which is formed. The combination of magnetic and electric fields in a near vacuum causes the sputtering action to occur.

Depositional thickness uniformity is an important requirement of sputtering systems. For large area substrates, uniform deposition is achieved by using large targets and linearly scanning the magnet assembly with respect to the target, producing uniform erosion of the target surface and uniform coating of the substrate. However, the inherent geometry of a large area sputtering system produces effects which limit thickness uniformity.

The magnet assembly is linearly scanned parallel to the target surface and perpendicular to the long dimension of the magnet assembly. This motion causes the plasma, which is formed a few millimeters away from the target surface, to sweep across the target surface. The geometry of the sputtering chamber affects the depositional thickness uniformity. In particular, when the chamber walls are relatively close to the ends of the racetrack-shaped plasma, the deposited films are relatively thin in the center of the substrate and relatively thick at the edges. It is desirable to provide a sputtering system which achieves depositional thickness uniformity.

SUMMARY OF THE INVENTION

According to a first aspect of the invention, a magnetron sputtering source for depositing a material onto a substrate is provided. The magnetron sputtering source comprises a target having a surface, spaced from the substrate, from which the material is sputtered, a magnet assembly disposed in proximity to the target for confining a plasma at the surface of the target and a drive assembly for scanning the magnet assembly relative to the target. The sputtering source further comprises an anode, adapted to be coupled to a voltage source, for maintaining substantially constant plasma characteristics as the magnet assembly is scanned relative to the target.

Preferably, the magnet assembly is linearly scanned by the drive assembly along a scan direction relative to the target, and the plasma defines an elongated plasma track having a long dimension perpendicular to the scan direction of the magnet assembly.

In a first embodiment, the anode comprises first and second stationary electrodes disposed at or near opposite ends of the path followed by the magnet assembly during scanning. Voltages coupled to the electrodes from the voltage source are varied as the magnet assembly is scanned along the path to maintain substantially constant plasma characteristics as the plasma position changes.

In a second embodiment, the anode comprises a stationary electrode disposed between the target and the substrate. The stationary electrode is transmissive of the target material being deposited on the substrate. The stationary electrode may comprise a plurality of spaced-apart anode wires or a mesh disposed between the target and the substrate.

In a third embodiment, a movable anode is scanned with the magnet assembly and maintains a fixed position relative to the magnet assembly during scanning. The anode may be disposed between the target and the substrate and may be mechanically coupled to the drive assembly. Preferably, the anode is mechanically coupled to the magnet assembly around opposite edges of the target. The anode may comprise elongated conductors disposed between the target and the substrate and spaced on opposite sides of the plasma. The anode may comprise a tube for circulating a cooling fluid or for delivering a process gas to the region of the plasma. The magnetron sputtering source may further include at least one process gas tube, movable with the anode, for delivering a process gas to the region of the plasma. A baffle structure may be disposed around the process gas tube or around the anode when it is used to deliver a process gas. The baffle structure directs a substantially uniform sheet of process gas in a selected direction, such as toward the substrate. The movable anode maintains substantially constant plasma characteristics as the plasma is scanned with respect to the target and the substrate.

According to a second aspect of the invention, a magnetron sputtering source for depositing a material onto a substrate is provided. The magnetron sputtering source comprises a target having a surface, spaced from the substrate, from which the material is sputtered, a magnet assembly disposed in proximity to the target for confining a plasma at the surface of the target and a drive assembly for scanning the magnet assembly relative to the target along a scan direction. The magnet assembly comprises a plurality of magnet elements. At least some of the magnet elements of the magnet assembly have different spacings from the surface of the target.

Preferably, the magnet assembly has an elongated configuration. Magnet elements near the ends of the magnet assembly may have a greater or a lesser spacing from the surface of the target than magnet elements near the center of the magnet assembly. The magnet assembly may comprise at least two sections connected by hinges. Preferably, the spacings between the magnet elements and the surface of the target are selected to produce substantially uniform deposition of the target material on the substrate.

According to a third aspect of the invention, a sputtering target assembly for a magnetron sputtering source is provided. The sputtering target assembly comprises a plurality of individual backing elements, each including a passage for a cooling fluid, target elements bonded to the surfaces of the backing elements and a support structure for mounting the backing elements and the target elements in predetermined positions in the target assembly. The support structure may include support elements for supporting opposite edges of the target assembly and a key retained in slots in adjacent backing elements. In a preferred embodiment, the sputtering target assembly includes four target elements and four backing elements, and each of the target elements has a square configuration.

According to a fourth aspect of the invention, a method for operating a magnetron sputtering source is provided. The sputtering source comprises a target having a surface from which material is sputtered, a magnet assembly for confining a plasma at the surface of a target and a drive assembly for linearly scanning the magnet assembly relative to the target. According to the method, the target is moved from a first fixed position relative to the magnet assembly to a second fixed position relative to the magnet assembly at least once during the operating life of the target. The first and second fixed positions are selected to extend the life of the target. Typically, the target is rotated about its center. The first and second fixed positions of the target assembly may differ by ±90% relative to the center of the target.

According to a fifth aspect of the invention, a method for operating a magnetron sputtering source is provided. The sputtering source comprises a target having a surface from which material is sputtered, a magnet assembly for confining a plasma at the surface of the target and a drive assembly for linearly scanning the magnet assembly relative to the target. According to the method, the speed of scanning of the magnet assembly is varied with respect to the target during scanning to obtain a desired sputtered film thickness characteristic on the target. In a preferred embodiment, the scanning speed is reduced near opposite edges of the target to achieve a substantially uniform sputtered film thickness.

According to a sixth aspect of the invention, a magnetron sputtering source for depositing a material onto a substrate is provided. The magnetron sputtering source comprises a movable assembly and a drive assembly for scanning the movable assembly along a prescribed linear path relative to the substrate. The movable assembly comprises a target having a surface from which the material is sputtered, a magnet assembly disposed in proximity to the target for confining a plasma at the surface of the target and an anode for producing electric fields in a region of the plasma.

BRIEF DESCRIPTION OF THE DRAWINGS

For better understanding of the present invention, reference is made to the accompanying drawings, which are incorporated herein by reference and in which.

DETAILED DESCRIPTION

Figure 1:
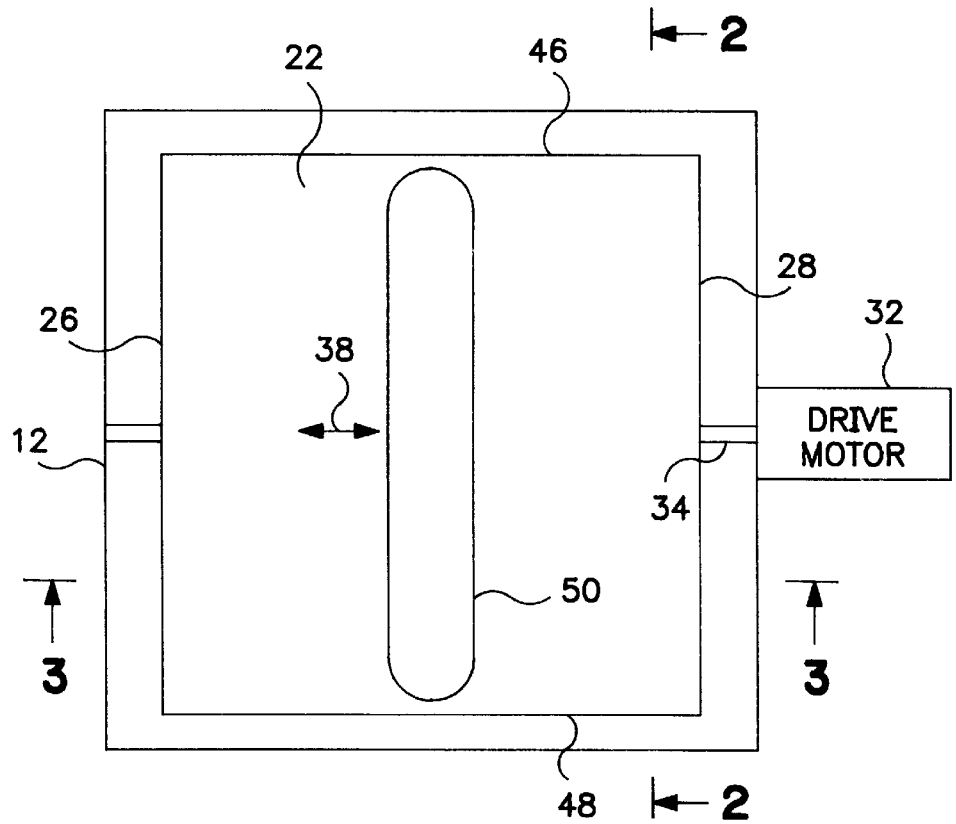
FIG. 1 is a schematic plan view of a linear scan magnetron sputtering system.
Figure 2:
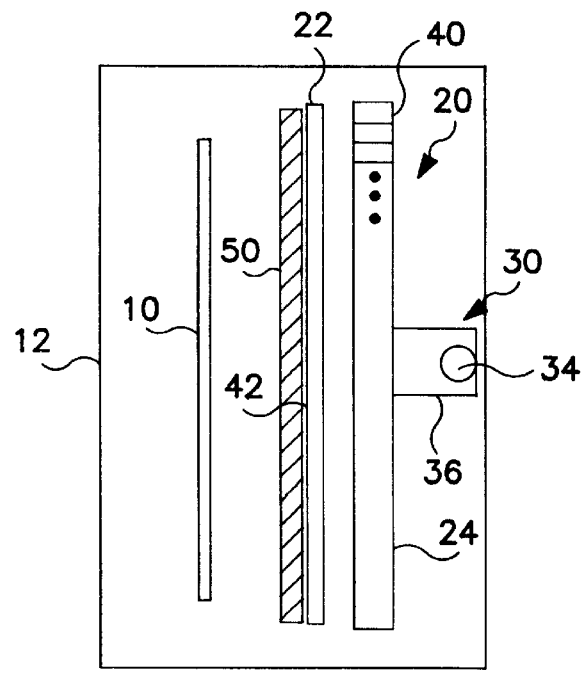
FIG. 2 is a schematic cross-sectional view of the sputtering system of FIG. 1, taken along the line 2—2 of FIG. 1.
Figure 3:
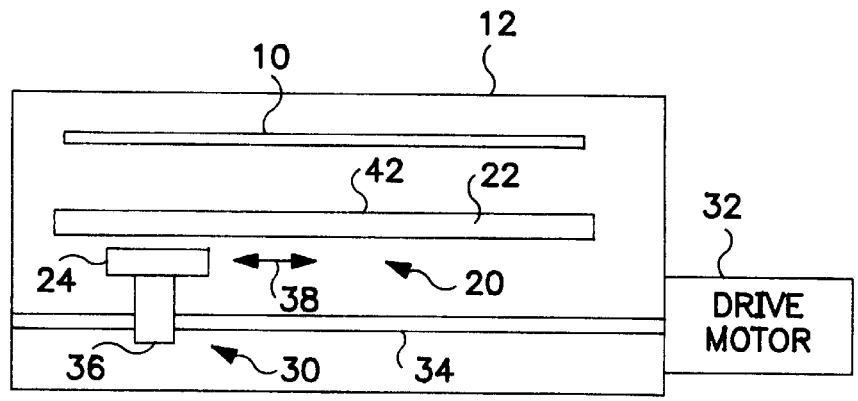
FIG. 3 is a schematic cross-sectional view of the sputtering system of FIG. 1, taken along the line 3—3 of FIG. 1, with the magnet assembly shifted to the left from the position shown in FIG. 1.

A simplified schematic diagram of a linear scan magnetron sputter coating system is shown in FIGS. 1–3. A substrate 10, such as for example a glass panel, is positioned in a vacuum chamber 12. A linear scan magnetron sputter source 20 comprises a sputtering target assembly including a target 22 of a material to be deposited on substrate 10, a magnet assembly 24, and a drive assembly 30 which causes the magnet assembly 24 to be scanned along a linear path with respect to target 22. The structure of the target assembly is described below. The drive assembly 30 may, for example, include a drive motor 32 connected to a ball shaft 34. The magnet assembly 24 is connected to ball shaft 34 by a ball nut 36. When the drive motor 32 is energized, the magnet assembly is scanned along a linear path, in a scan direction 38, below target 22 over substantially the entire area of target 22. The magnet assembly 24 is scanned with a reciprocating linear movement and changes direction at or near opposite edges 26 and 28 of the target.

Figure 19:
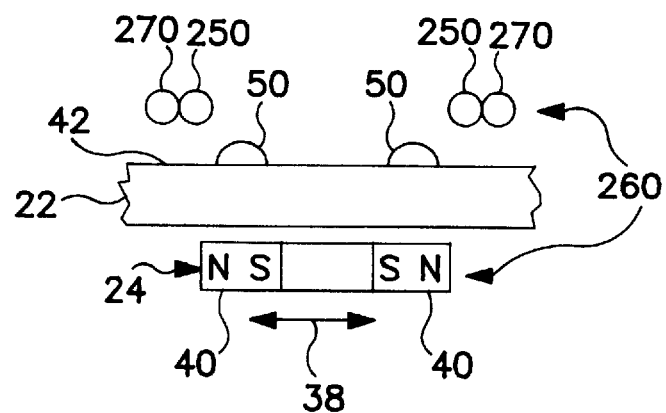
FIG. 19 is an enlarged partial cross-sectional view of the magnet assembly, target and anode, illustrating features of the invention.

An array of magnet elements 40 in magnet assembly 24 produces magnetic fields which penetrate target 22 and form arcs over a surface 42 of target 22 facing substrate 10 (see FIG. 19). The magnetic field helps to confine electrons in an area near the surface 42 of the target. The increased concentration of electrons produces high densities of inert gas ions, typically argon, and enhances the efficiency of the sputtering process. In particular, the region of most intense ionization forms a plasma 50 near the surface 42 of target 22. The plasma 50 follows a closed-loop plasma track having the shape of an elongated oval. The plasma may be described as racetrack shaped. The racetrack-shaped plasma 50 is disposed with its long dimension perpendicular to the scan direction 38 of magnet assembly 24. The ends of the racetrack-shaped plasma 50 may be straight or curved and are located at or near edges 46 and 48 of target 22. As the magnet assembly 24 is scanned with respect to target 22, the plasma 50 follows the instantaneous position of the magnet assembly 24 and sputters areas of the target 22. The size and shape of plasma track 50 and the path followed by magnet assembly 24 during scanning are selected such that the plasma is scanned over substantially the entire area of target 22 and sputters material from target 22. A portion of the sputtered material is deposited on substrate 10.

In some applications, sputter coating of large area substrates may be required. In particular, sputter coating of glass panels having dimensions on the order of 650×650 millimeters (mm) may be required. Typically, the sputtering target 22 is somewhat larger than the substrate to ensure uniform depositional thickness of the deposited coating. Thus, targets having dimensions on the order of 34 inches on a side may be required. The target material is bonded to a water-cooled backing plate and is required to maintain dimensional stability and flatness over its operating life.

Figure 4:
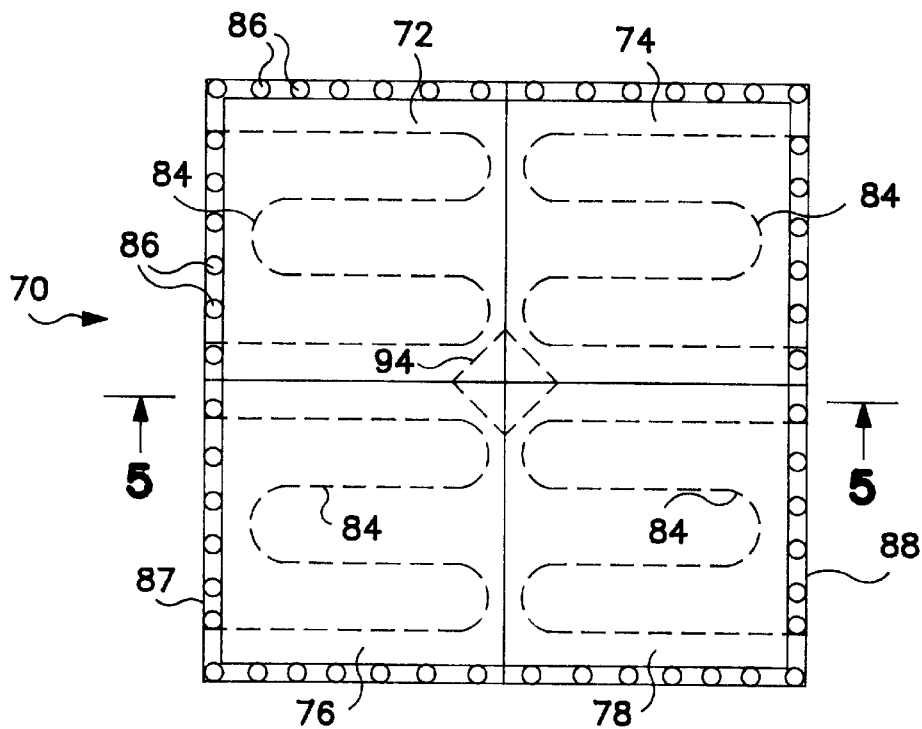
FIG. 4 is a schematic plan view of a sputtering target assembly in accordance with the present invention.
Figure 5:
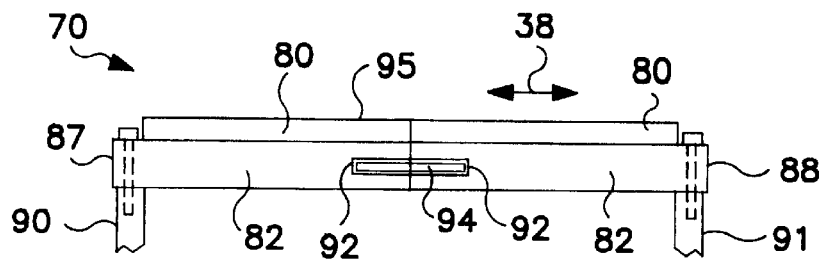
FIG. 5 is a schematic cross-sectional view of the sputtering target assembly of FIG. 4.

According to a first aspect of the invention, the target is constructed in sections as shown in FIGS. 4 and 5. A target assembly 70 includes a first section 72, a second section 74, a third section 76, and a fourth section 78. Each section includes a target element 80 bonded to a backing plate 82. The target element 80 is the material to be sputtered onto the substrate. The backing plate 82 forms a support for target element 80 and typically includes a passage 84 for circulation of a cooling fluid. The target element 80 may be bonded to backing plate 82 by solder, typically an indium alloy solder. The backing plate 82 may, for example, be copper. The target elements and the backing plates are typically rectangular or square. The backing plate 82 extends beyond target element 80 along two outside edges of target assembly 70 and is provided with mounting holes 86. The target assembly 70 is supported at opposite edges 87 and 88 by support elements 90 and 91, respectively. Preferably, the target assembly 70 is supported only along edges 87 and 88 at the ends of the scan path, leaving the remainder of the front and back surfaces exposed. The backing plate 82 is provided with mounting holes 86 along two outside edges, as shown in FIG. 4, to permit the target assembly to be rotated as described below. The target sections may be spaced apart by a sufficient distance, typically on the order of 0.5 mm, to allow for unrestricted thermal expansion and contraction of the target sections. The relatively small spacing between target sections does not appreciably affect the uniformity of the deposited film on the substrate. Adjoining edges of the target sections adjacent to the center of the target assembly may be provided with slots 92 for a key 94. The key 94 establishes the desired relative positions of the target sections in the target assembly and prevents relative movement of the target sections perpendicular to a target surface 95. The key 94 may, for example, have dimensions of 2.0×2.0×0.25 inches. The target assembly 70 is typically mounted vertically in a sputter coating system. The mounting arrangement, including support elements 90 and 91, and key 94, retains the target sections in fixed relative positions in the target assembly 70. With the exception of the target surface 95 which faces the substrate, the target assembly is preferably surrounded by a grounded shield (not shown).

The configuration of the target assembly shown in FIGS. 4 and 5 and described above limits bowing of the target by providing small target sections. The reduction of bowing as compared with a single large target simplifies fabrication and the bonding process, and reduces the chance of breakage when the target material is a ceramic such as indium tin oxide. It will be understood that the target assembly may be fabricated with two or more target sections and that the target sections may have any desired size or shape.

Figure 6:
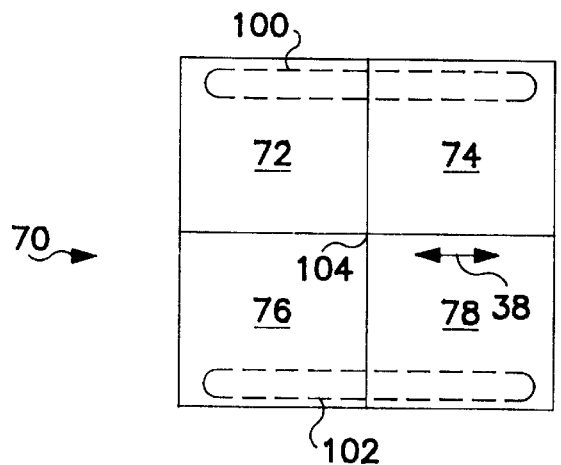
FIG. 6 is a schematic plan view of a sputtering target assembly, illustrating erosion grooves produced by a racetrack-shaped magnet assembly.
Figure 7:
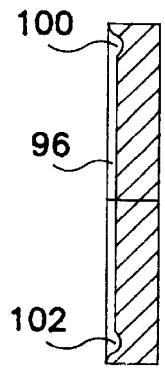
FIG. 7 is a partial schematic cross-sectional view of the sputtering target assembly of FIG. 6, illustrating target erosion.
Figure 8:
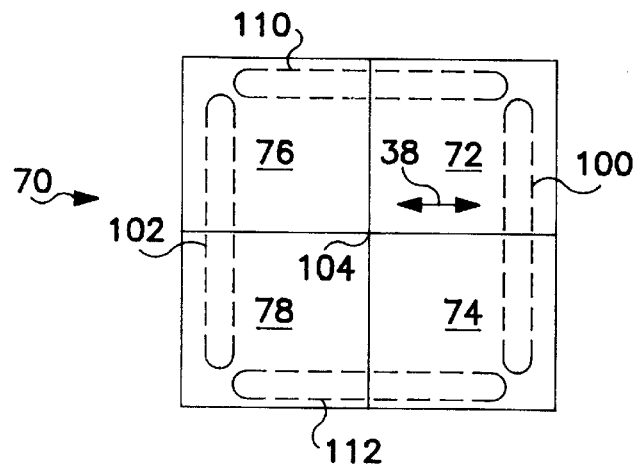
FIG. 8 is a schematic plan view of the sputtering target assembly of FIG. 6 after rotation by 90%.

A further aspect of the invention is illustrated in FIGS. 6–8. For simplicity of illustration, only the target elements of each target section are shown. Also, to assist in understanding the invention, the thickness of the target elements relative to their lateral dimensions is exaggerated in FIG. 7. A typical erosion pattern 96 for a linear scan magnetron sputtering source is shown in FIGS. 6 and 7. The target is eroded over substantially its entire surface (FIG. 7). However, erosion grooves 100 and 102 form along opposite edges of the target assembly 70 parallel to the scan direction 38 of the magnet assembly. The formation of erosion grooves 100 and 102 may be understood with reference to FIG. 1. Because the end portions of plasma 50 are located near opposite edges 46 and 48 of the target 22, the length of plasma above these regions is greater than in the center portion of the plasma 50, resulting in increased erosion. When the erosion grooves 100 and 102 reach a depth that is a substantial fraction of the target thickness, the target is ordinarily replaced in order to avoid the risk of contamination of the substrate.

In a second aspect of the invention, the target assembly is moved, at least once during its operating life, from a first fixed position relative to the magnet assembly to a second fixed position relative to the magnet assembly. As illustrated in FIG. 8, the target assembly 70 is rotated by 90% about center 104 relative to the position shown in FIG. 6. This causes erosion grooves 100 and 102 to be oriented perpendicular to scan direction 38 of magnet assembly 24, as shown in FIG. 8. During operation of the sputtering system following rotation of the target assembly 70, new erosion grooves 110 and 112 form on the other two edges of the target assembly parallel to scan direction 38. By rotating the target assembly 70 at least once during its operating life, the life of the target is extended, and target utilization is increased. Erosion grooves are formed along all four sides of the target, and utilization of the center region of the target is effectively doubled. Preferably, the target assembly is rotated at a time during its life when erosion grooves 100 and 102 would otherwise require replacement of the target. However, the target assembly can be rotated more frequently if desired. As is apparent from FIG. 8, the target assembly 70 may be rotated about center 104 by ±90% with respect to the initial position shown in FIG. 6.

As indicated above, a linear scan magnetron sputtering system with a large target area and chamber walls close to the edges of the substrate produces deposited films that are relatively thick near the outside edges of the substrate and relatively thin in a center region of the substrate. It is believed that this is due to the fact that the electrons in the plasma near the center of the target cannot escape as easily as electrons in the plasma near the edges of the target. Less electron loss means that the plasma becomes easier to sustain. Hence the plasma voltage drops and sputter yield correspondingly drops.

Figure 9:
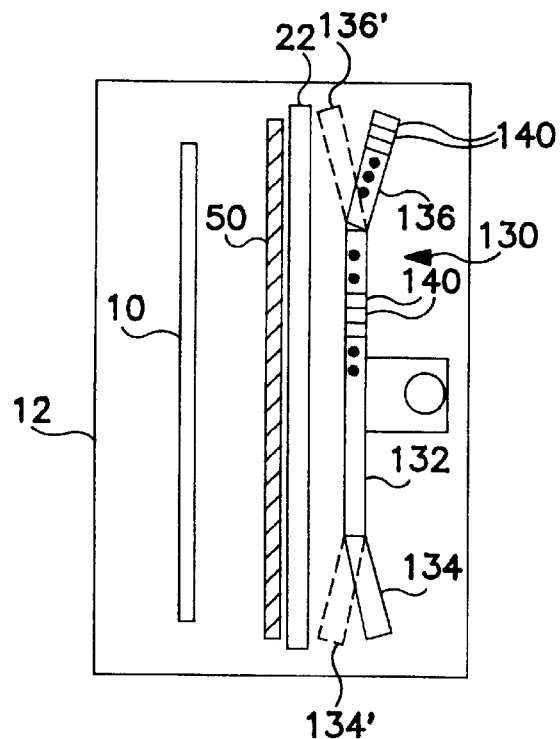
FIGS. 9 and 10 are schematic cross-sectional views of sputtering systems wherein the magnet assembly includes magnet elements having variable spacings from the target surface.
Figure 10:
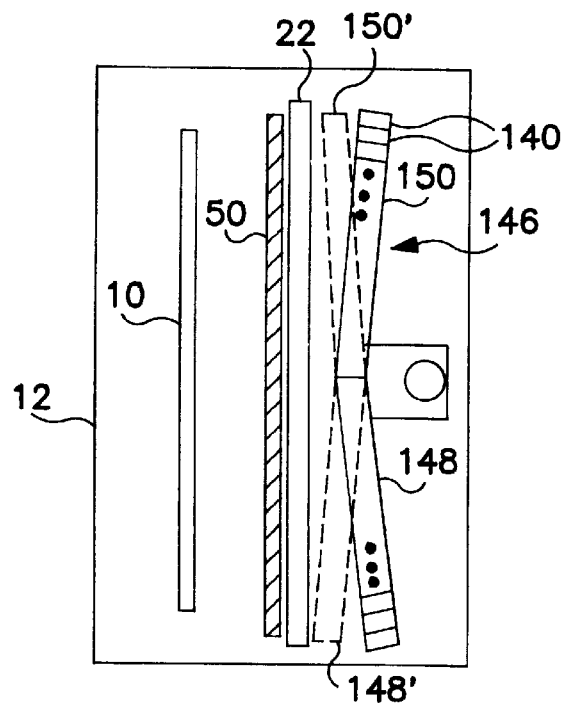

Based on a recognition of the relationship between magnetic field strength and plasma intensity, the plasma intensity may be reduced by reducing the magnetic fields near the ends of the magnet assembly relative to the magnetic fields in the center region. This may be accomplished by making the spacing between the magnet assembly and the target surface relatively small in the center region of the target and larger near the ends. Magnet assemblies having variable spacing from the target surface are shown in FIGS. 9 and 10. Like elements in FIGS. 1–3, 9 and 10 have the same reference numerals.

As shown in FIG. 9, a magnet assembly 130 includes a center section 132 and end sections 134 and 136 connected to opposite ends of center section 132. Each of the sections 132, 134 and 136 of magnet assembly 130 includes a plurality of magnet elements 140 which generate magnetic fields at the surface of target 22 for producing plasma 50. The magnet elements 140 of sections 134 and 136 near the ends of magnet assembly 130 are spaced farther from target 22 than the magnet elements 140 of center section 132. The end sections 134 and 136 may be linear or nonlinear and may be connected to center section 132 in a fixed orientation or may be connected by hinges to permit adjustment of the spacings between the magnet elements 140 of end sections 134 and 136 and target 22. Furthermore, the relative lengths of center section 132 and end sections 134 and 136 may be varied within the scope of the invention. In another configuration of magnet assembly 130, the magnet elements 140 of sections 134 and 136 are closer to target 22 than the magnet elements 140 of center section 132, as illustrated in phantom by end sections 134R and 136R in FIG. 9. This configuration may be used to improve thickness uniformity in some applications.

An alternate embodiment is shown in FIG. 10. A magnet assembly 146 includes a first section 148 and a second section 150. Each section includes magnet elements 140. The sections 148 and 150 of magnet assembly 146 are oriented such that the spacings between magnet elements 140 and target 22 are less near the center of the magnet assembly than the spacings of magnet elements near the ends. The sections 148 and 150 may be linear or nonlinear and may be connected in a fixed orientation or may be hinged. In another configuration, the sections 148 and 150 of magnet assembly 146 may be oriented such that the spacings between magnet elements 140 and target 22 are greater near the center of the magnet assembly than the spacings of magnet elements 140 near the ends. This configuration is illustrated in phantom in FIG. 10 by sections positions 148R and 150R of the magnet assembly 146. This configuration may provide improved uniformity in certain applications.

The magnet structures shown in FIGS. 9 and 10, wherein the magnet elements near the ends of the magnet assembly are spaced from target 22 by a greater or a lesser distance than magnet elements near the center of the magnet assembly, provides improved uniformity along a direction parallel to the long dimension of the magnet assembly, as compared with a magnet assembly having uniform spacing from the target. This configuration does not require magnet elements with different sizes, strengths and/or spacings to achieve uniformity.

The magnet assembly configurations shown in FIGS. 9 and 10 address the issue of depositional thickness uniformity along the long dimension of the magnet assembly. However, variations in thickness uniformity have also been observed along the scan direction of the magnet assembly (perpendicular to the long dimension of the magnet assembly). This variation is believed to be due to the fact that the spacing between the plasma and the grounded vacuum chamber wall varies as the magnet assembly is scanned, causing a variation in electric field in the region of the plasma. The variation in electric field, in turn, causes a variation in sputtering rate.

Figure 11:
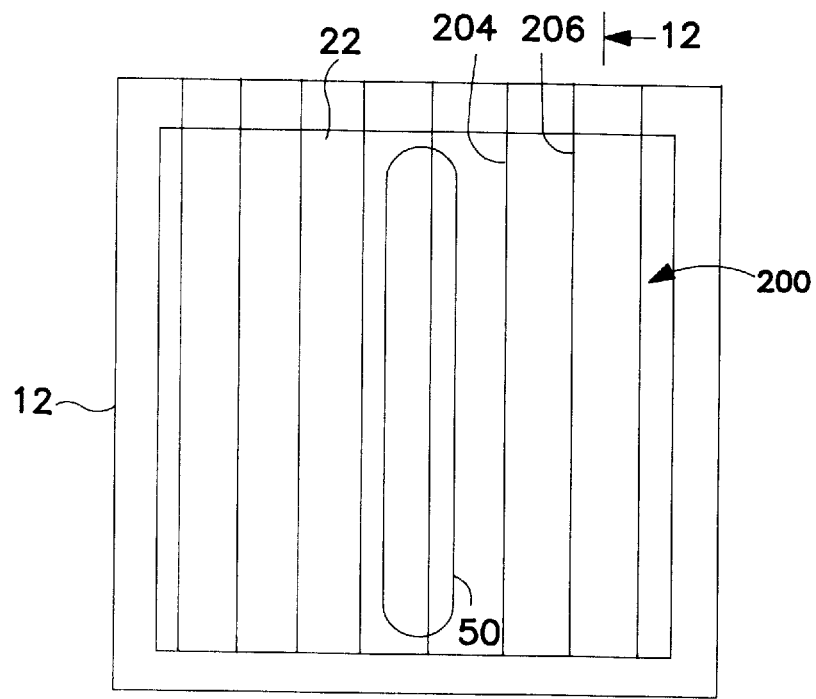
FIG. 11 is a schematic plan view of a linear scan magnetron sputtering system utilizing anode wires between the target and the substrate.
Figure 12:
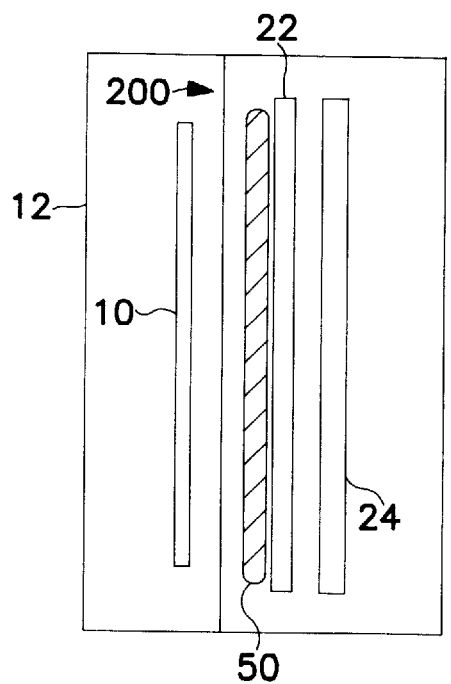
FIG. 12 is a cross-sectional view of the sputtering system of FIG. 11, taken along the line 12—12 of FIG. 11.

A further aspect of the invention is described with reference to FIGS. 11 and 12. Like elements in FIGS. 1–3, 11, and 12 have the same reference numerals. The drive assembly is omitted from FIGS. 11 and 12 for simplicity of illustration. In the embodiment of FIGS. 11 and 12, a stationary electrode 200 is positioned within vacuum chamber 12 between target 22 and substrate 10. The stationary electrode 200 must be substantially transparent to the material sputtered from target 22 onto substrate 10. This may be achieved, for example, by utilizing a series of spaced-apart anode wires or by a conductive mesh with relatively large open areas. In the example of FIGS. 11 and 12, the stationary electrode 200 comprises spaced-apart, parallel anode wires 204, 206, etc. positioned between target 22 and substrate 10 and connected to a suitable potential, such as ground. The anode wires may be connected to the vacuum chamber walls or to a separate voltage source. The stationary electrode between target 22 and substrate 10 provides a fixed potential, such as ground potential, with little variation in distance from plasma 50 as the magnet assembly 24 is scanned over target 22. Thus, a substantially constant electric field is present in the region of the plasma 50 at all times during scanning. The substantially constant electric field, in turn, produces substantially constant plasma characteristics as the magnet assembly 24 is scanned over target 22. The diameters of the anode wires 204, 206, etc. and the spacing between anode wires are selected to provide a substantially constant electric field (i.e., constant within about 5%) in the region of plasma 50 as the magnet assembly 24 is scanned over target 22 and to permit most of the sputtered material from target 22 to reach substrate 10. In one example, tungsten wires having diameters of 0.030 inch, with a spacing between anode wires of one inch, were found to provide excellent uniformity results.

Figure 13:
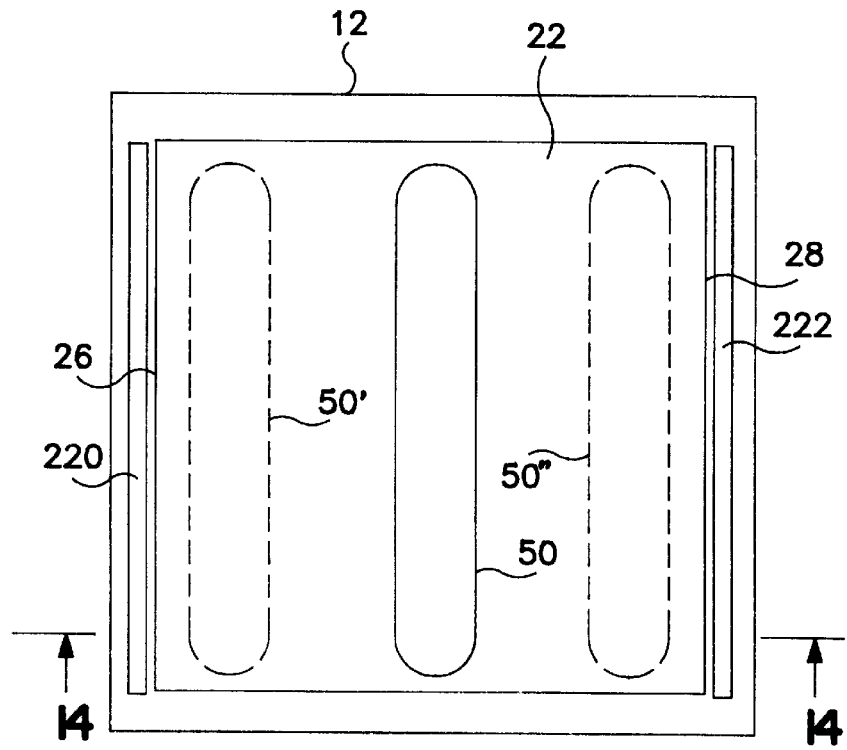
FIG. 13 is a schematic plan view of a linear scan magnetron sputtering system including stationary anodes near opposite edges of the sputtering target.
Figure 14:
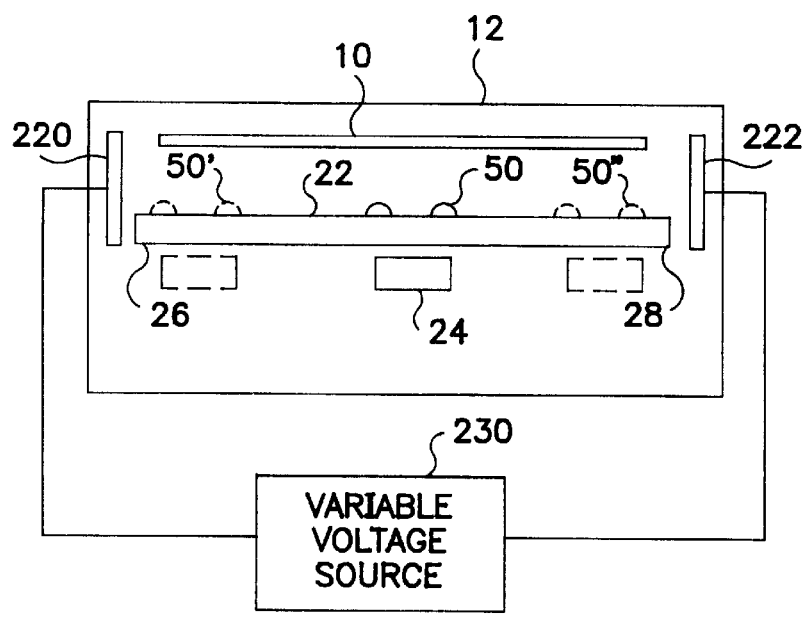
FIG. 14 is a cross-sectional schematic view of the sputtering system of FIG. 13, taken along the line 14—14 of FIG. 13.

Yet another aspect of the invention is described with reference to FIGS. 13 and 14. Like elements shown in FIGS. 1–3, 13, and 14 have the same reference numerals. The drive assembly is omitted from FIGS. 13 and 14 for simplicity of illustration. The configuration of FIGS. 13 and 14 utilizes a first stationary electrode 220 and a second stationary electrode 222 positioned along opposite edges of target 22 at or near opposite ends of the path followed by magnet assembly 24 during scanning. The stationary electrodes 220 and 222 are preferably located adjacent to opposite edges 26 and 28, respectively, of target 22 and adjacent to the region between target 22 and substrate 10. Scanning of magnet assembly 24 and plasma 50 is illustrated in FIGS. 13 and 14 by plasma position 50. at the left side of target 22 and plasma position 50. at the right side of target 22. Thus, the position of plasma 50 relative to electrodes 220 and 222 varies during scanning of the magnet assembly. Electrodes 220 and 222 are preferably connected to a variable voltage source 230.

Figure 15:
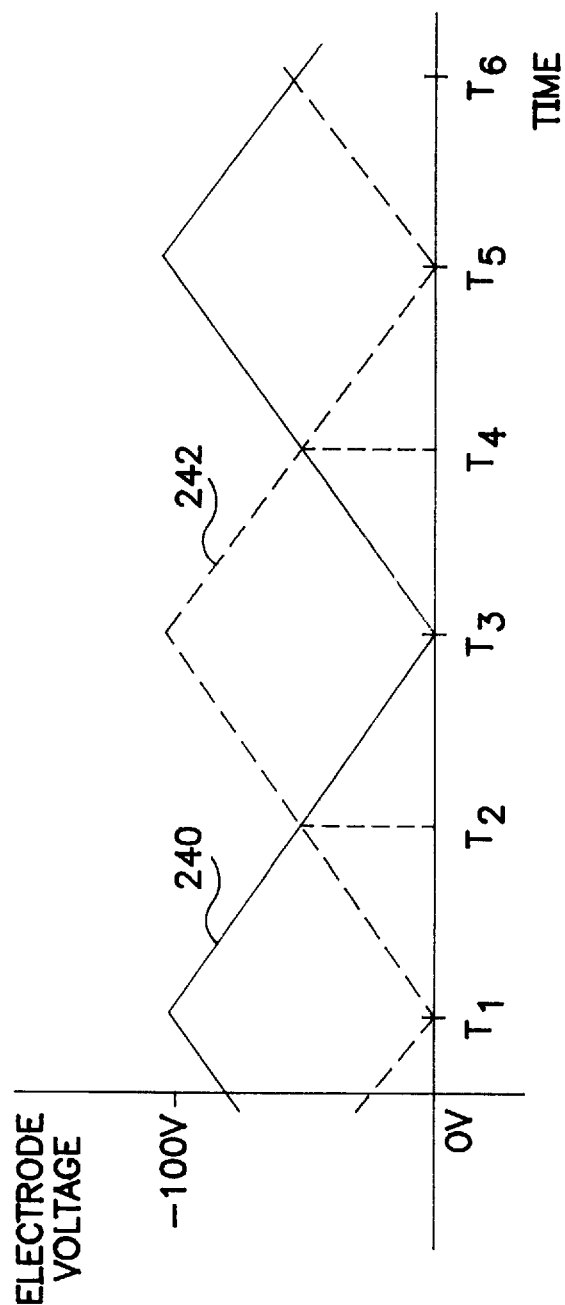
FIG. 15 is a graph of electrode voltage as a function of time, illustrating an example of voltage waveforms that may be applied to the stationary anodes of FIGS. 13 and 14.

The voltages applied to electrodes 220 and 222 by voltage source 230 may be varied in synchronism with scanning of magnet assembly 24 and plasma 50 to produce substantially constant plasma characteristics during scanning. An example of suitable waveforms for application to electrodes 220 and 222 is shown in FIG. 15. A waveform 240 is applied to electrode 220, and a waveform 242 is applied to electrode 222. Each waveform may, for example, vary linearly between 0 volts when the plasma 50 is farthest from the electrode in the scan cycle and −100 volts when the plasma 50 is closest to the electrode during the scan cycle. In FIG. 15, times $T_1$ and $T_6$ correspond to times when the plasma 50 is near electrode 220; times $T_2$ and $T_5$ correspond to times when the plasma 50 is at the middle of the scan cycle; and time $T_3$ corresponds to a time when the plasma 50 is located near electrode 222. It will be understood that different waveforms and voltage levels may be used in different applications. The electrodes 220 and 222 may be shaped to enhance the thickness uniformity of the sputtered film. Furthermore, electrodes 220 and 222 may be segmented, with different voltages applied to different segments to enhance thickness uniformity of the sputtered film.

Figure 16:
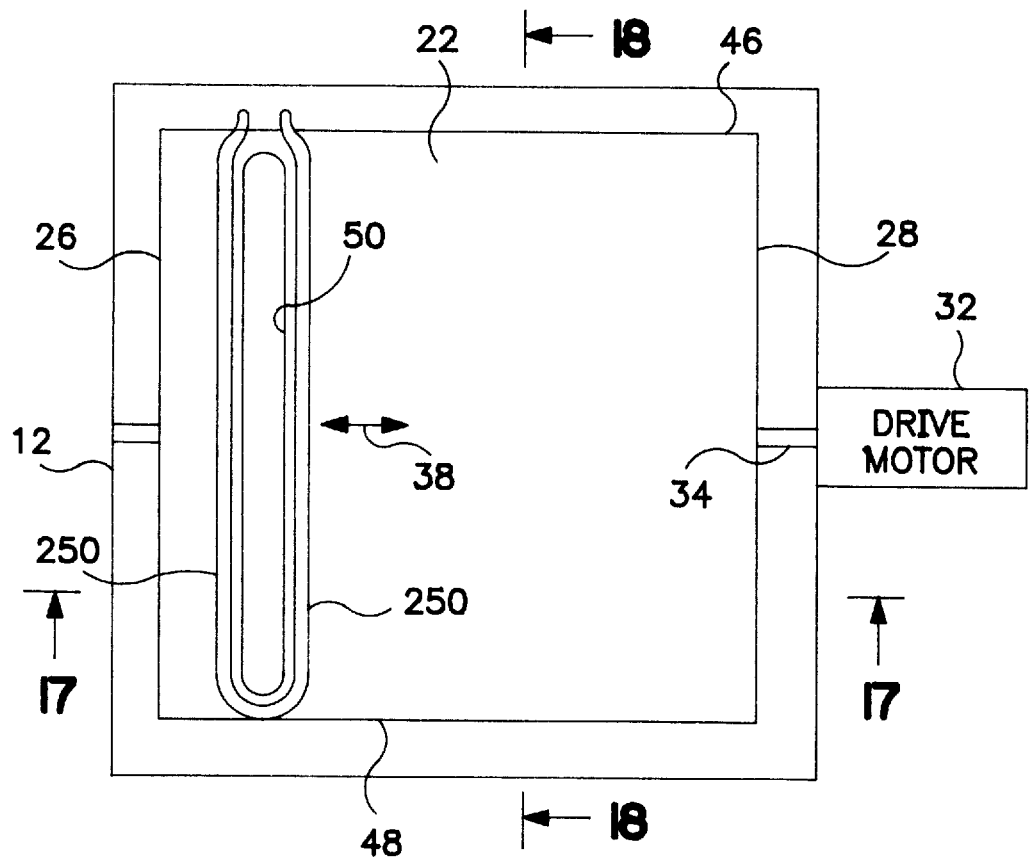
FIG. 16 is a schematic plan view of a linear scan magnetron sputtering system including an anode that is scanned with the magnet assembly.
Figure 17:
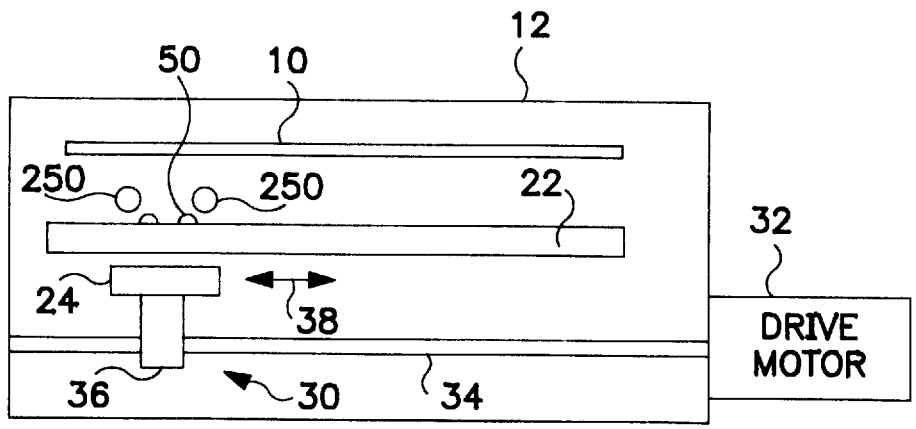
FIG. 17 is a cross-sectional view of the sputtering system of FIG. 16, taken along the line 17—17 of FIG. 16.
Figure 18:
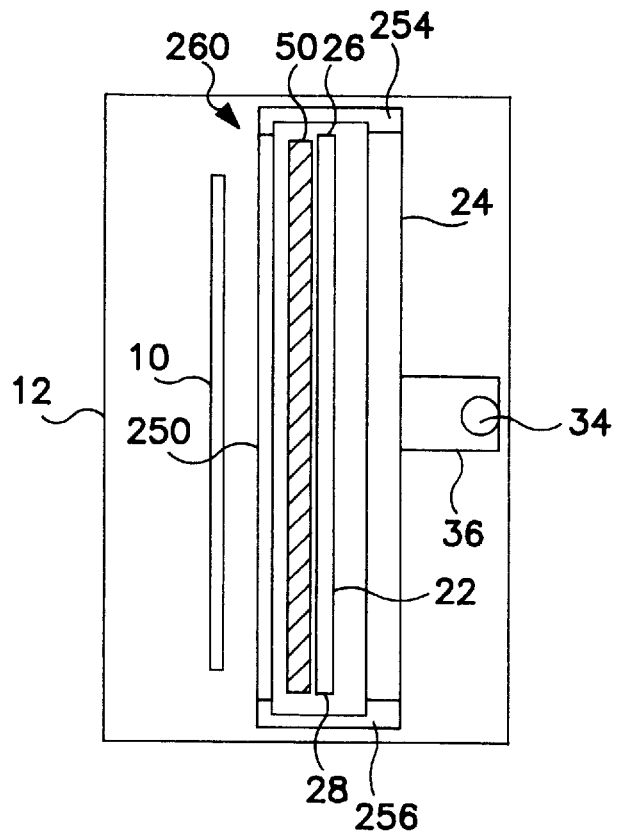
FIG. 18 is a cross-sectional view of the sputtering system of FIG. 16, taken along the line 18—18 of FIG. 16.

A further embodiment of the linear scan magnetron sputtering system of the invention is shown in FIGS. 16–18. Like elements in FIGS. 1–3 and 16–18 have the same reference numerals. In the embodiment of FIGS. 16–18, a scanning anode 250 is mechanically coupled to the drive assembly 30 and is scanned with the magnet assembly 24. The anode 250 is positioned between target 22 and substrate 10 in alignment with magnet assembly 24. As a result, anode 250 remains in a fixed relationship with respect to plasma 50 during scanning. The anode 250 preferably comprises one or more elongated conductors of relatively small diameter so as to avoid significantly blocking sputtered target material from reaching substrate 10. In the example of FIGS. 16–18, the anode 250 is mechanically coupled to magnet assembly 24 by support members 254 and 256 to form a moving assembly 260. Support member 254 is connected between one end of anode 250 and one end of magnet assembly 24 around edge 26 of target 22; and support member 256 is connected between the other end of anode 250 and the other end of magnet assembly 24 around edge 28 of target 22. The support elements 254 and 256 are preferably non-conducting, so that anode 250 and magnet assembly 24 may be maintained at different electrical potentials. The configuration of the target assembly shown in FIGS. 4 and 5 and described above facilitates connection of support elements 254 and 256 between anode 250 and magnet assembly 24 and permits scanning of the moving assembly 260 with respect to target 22, because the target is mechanically supported only along opposite edges at the ends of the linear scan. The anode 250 may be connected to a fixed voltage, such as ground, and maintains a substantially constant electric field in the region of plasma 50, and thereby maintains substantially constant plasma characteristics, during scanning by magnet assembly 24. The embodiment of FIGS. 16–18 provides more constant electric fields in the region of plasma 50, and therefore more constant plasma characteristics, than the embodiments of FIGS. 11–14, because the anode 250 has a fixed physical relationship with plasma 50 during scanning.

It will be understood that different mechanical configurations may be utilized for supporting and scanning anode 250. For example, anode 250 may be connected directly to drive assembly 30 rather than to magnet assembly 24 or may be connected to a second drive assembly synchronized with drive assembly 30. The principal requirement is that the anode 250 move in synchronism with magnet assembly 24 during scanning, so that a fixed physical relationship is maintained between anode 250 and plasma 50. The anode 250 may utilize two parallel conductors as shown in FIG. 16, a single conductor or more than two conductors. The principal requirements are that the anode maintain substantially constant plasma characteristics during scanning, without substantially blocking sputtered target material from reaching substrate 10.

Additional features of the moving anode embodiment of FIGS. 16–18 are described with reference to FIG. 19. A partial schematic elevation view of the sputtering source is shown. Like elements in FIGS. 16–19 have the same reference numerals. The drive assembly is omitted from FIG. 19 for simplicity of illustration. In a preferred embodiment, the anode 250 is configured as a conductive tube, and a cooling gas or liquid is circulated through the conductive tubes. The conductive tube is maintained at a desired potential, such as ground, and the circulating fluid limits temperature rise of the anode.

According to a further feature of the scanning anode embodiment of FIGS. 16–18, the moving assembly 260, which includes magnet assembly 24 and anode 250, may further be provided with one or more process gas tubes 270. The process gas tubes may be located adjacent to anode 250 between target 22 and substrate 10. The process gas tubes 270 may include perforations for delivering a process gas to the region of plasma 50, typically directed toward the substrate 10. The process gas may be utilized in the sputtering process. Examples of process gases utilized in sputtering include nitrogen and oxygen. The configuration of FIG. 19 has the advantage that the process gas is delivered directly to the region of plasma 50 during scanning of magnet assembly 24. It will be understood that any number of process gas tubes may be utilized. Furthermore, different process gas tubes may deliver different process gases. When active cooling of the anode 250 is not required, the anode may be configured as a conductive tube having perforations for delivering a process gas to a region of plasma 50.

It will be understood that the electrical connections to anode 250, the delivery and exhaust of cooling fluid to anode 250 and the delivery of process gas to process gas tubes 270 all require flexible connections between the moving assembly 260 and the fixed portion of the sputtering system. Conventional flexible connections may be utilized.

Figure 20A:
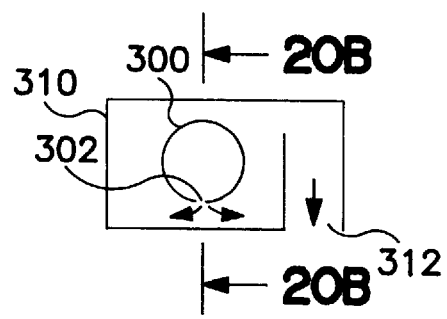
FIG. 20A is a schematic cross-sectional view of an anode and baffle structure, illustrating a feature of the invention.
Figure 20B:
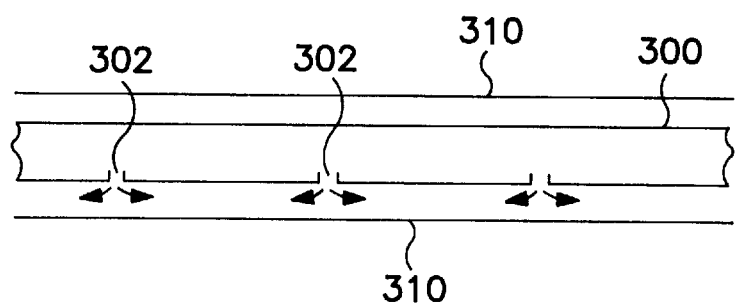
FIG. 20B is a schematic cross-sectional view of the anode and baffle structure, taken along the line 20B—20B of FIG. 20A.

An additional feature of the scanning anode embodiment of FIGS. 16–19 is described with reference to FIGS. 20A and 20B. A tube 300 for delivering a process gas is provided with perforations 302 spaced apart along its length. The tube 300 may correspond to anode 250 or to process gas tube 270 described above. A baffle structure 310 is disposed around tube 300 along its length. The baffle structure 310 may provide a serpentine path between perforations 302 in tube 302 in tube 300 and an outlet 312. The baffle structure 310 spreads the gas flow delivered by tube 300 through perforations 302 and provides a substantially uniform, linear curtain of process gas directed preferentially in a selected direction, such as toward the substrate. Typically, the process gas is required to react with material of the target at the substrate surface. For example, magnesium oxide may be formed on the substrate from a magnesium target and oxygen gas delivered through tube 300. Where the process gas is not directed toward the substrate, magnesium oxide may form on the target surface. Magnesium oxide contamination of the target is likely to interfere with the sputtering process. The configuration shown in FIGS. 20A and 20B and described above substantially reduces the amount of process gas that reaches the target surface. It will be understood that a variety of different baffle structures, shapes and configurations may be utilized to direct the gas flow toward the substrate.

Figure 21:
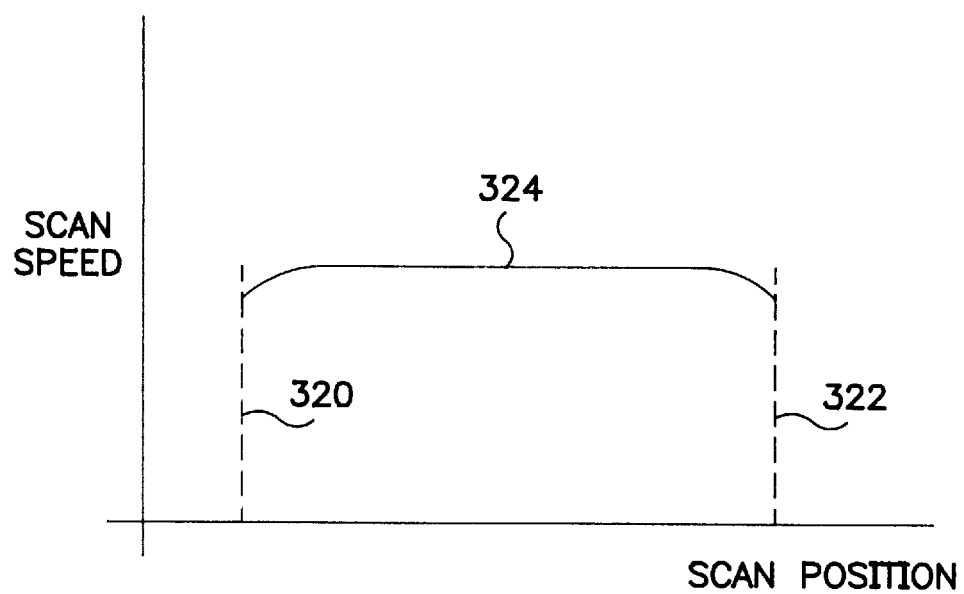
FIG. 21 is a graph of scan speed as a function of position along the scan path, illustrating a feature of the invention.

Thus far, it has been assumed that the scan speed of the magnet assembly 24 is substantially constant between the ends of the scan path. In accordance with another feature of the invention, the scan speed may be varied as a function of magnet assembly position to control uniformity of the deposited film. By decreasing the scan speed in a specified region, the film thickness is increased. Conversely, by increasing the scan speed in a specified region, the film thickness is decreased. An example of a scan speed profile is shown in FIG. 21. Scan speed is plotted as a function of position along the scan path. With reference to FIG. 16, scan position 320 corresponds to edge 26 of target 22, and scan position 322 corresponds to edge 28 of target 22. A scan speed profile 324 is characterized by reduced speed near edges 26 and 28 of target 22, thereby increasing the deposited film thickness near the edges of the substrate. It will be understood that the scan speed can be increased or decreased in any desired region of the scan path.

Figure 22:
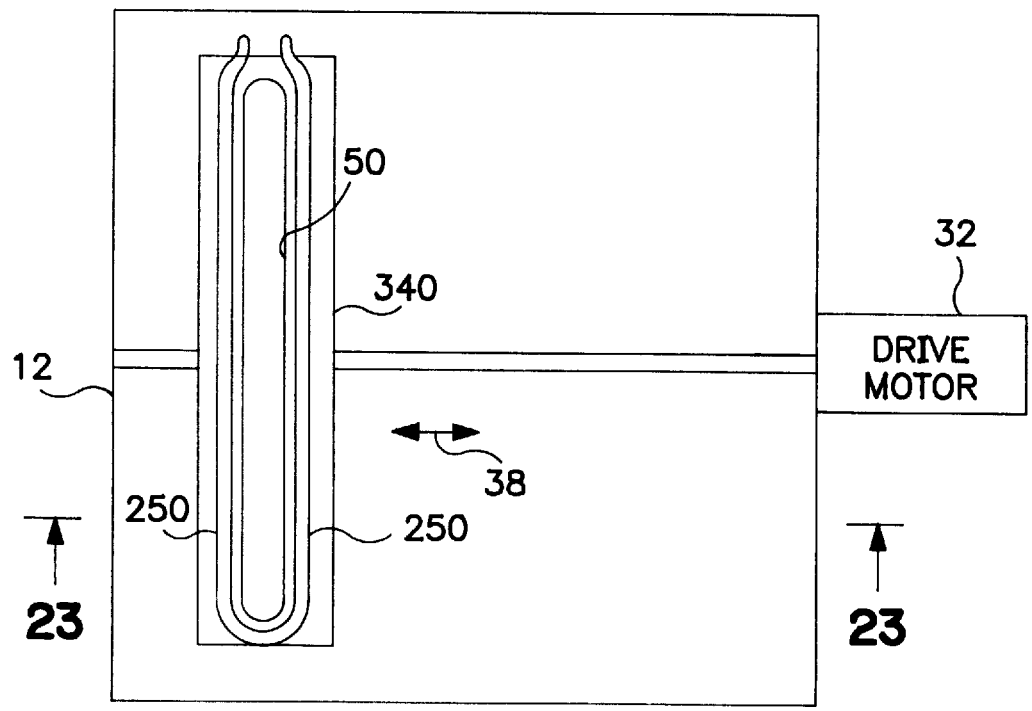
FIG. 22 is a schematic plan view of a linear scan magnetron sputtering system including an anode and a target that are scanned with the magnet assembly.
Figure 23:
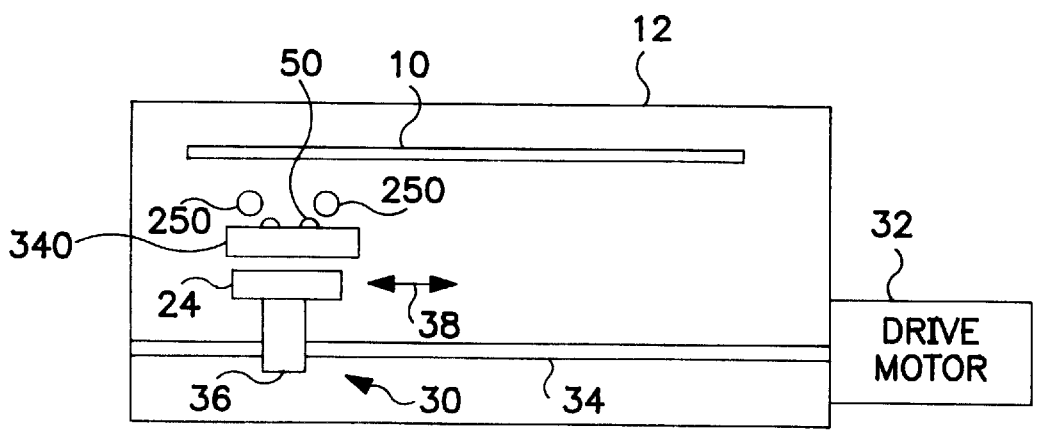
FIG. 23 is a cross-sectional view of the sputtering system of FIG. 22, taken along the line 23—23 of FIG. 22.

A further embodiment of the linear scan magnetron sputtering system of the invention as shown in FIGS. 22 and 23. Like elements in FIGS. 1–3, 16–18, 22 and 23 have the same reference numerals. In the embodiments described above, the target is fixed in position and the magnet assembly is scanned with respect to the target. In the embodiment of FIGS. 22 and 23, a movable target 340 is utilized. The movable target 340 may be mechanically coupled to magnet assembly 24 and anode 250. The magnet assembly 24, anode 250 and target 340 constitute a moving assembly that is linearly scanned with respect to substrate 10. The moving target 340 may be substantially smaller than a fixed target. In particular, the surface of target 340 facing substrate 10 may be dimensioned such that it is not substantially larger than the area covered by plasma 50. The configuration of FIGS. 22 and 23 has an advantage that contamination of the target surface is reduced, because the plasma 50 covers substantially the entire target surface during operation and prevents contamination buildup.

While there have been shown and described what are at present considered the preferred embodiments of the present invention, it will be obvious to those skilled in the art that various changes and modifications may be made therein without departing from the scope of the invention as defined by the appended claims.

What is claimed is:

1. A magnetron sputtering source for depositing a material onto a substrate, comprising:

a target having a surface, spaced from the substrate, from which the material is sputtered;

a magnet assembly disposed in proximity to said target for confining a plasma at the surface of said target;

a drive assembly for scanning said magnet assembly in a linear path relative to said target; and an anode assembly including an anode positioned in a generally fixed physical relationship to said magnet assembly as said magnet assembly is scanned relative to said target, said anode is adapted to be coupled to a voltage source, for maintaining substantially constant plasma characteristics as said magnet assembly is scanned relative to said target.

2. A magnetron sputtering source as defined in claim 1 wherein said anode is coupled to ground potential.

3. A magnetron sputtering source as defined in claim 1 wherein said magnet assembly is linearly scanned by said drive assembly along a scan direction relative to said target and wherein said plasma comprises an elongated, racetrack-shaped plasma having a long dimension perpendicular to said scan direction.

4. A magnetron sputtering source as defined in claim 1 wherein said magnet assembly is linearly scanned by said drive assembly along a scan direction relative to said target and wherein said drive assembly includes means for varying a scan speed of said magnet assembly as said magnet assembly is scanned relative to said target.

5. A magnetron sputtering source as defined in claim 4 wherein said means for varying the scan speed of said magnet assembly includes means for reducing the scan speed near opposite edges of said target.

6. A magnetron sputtering source for depositing a material onto a substrate, comprising:

a target having a surface, spaced from the substrate, from which the material is sputtered;

a magnet assembly disposed in proximity to said target for confining a plasma at the surface of said target;

a drive assembly for scanning said magnet assembly in a generally linear path relative to said target; and an anode assembly, adapted to be coupled to a voltage source;

wherein said magnet assembly is scanned along a path having ends adjacent to opposite edges of said target, wherein said anode assembly comprises first and second stationary electrodes disposed at or near opposite ends of said path and wherein voltages coupled to said electrodes from said voltage source are varied as said magnet assembly is scanned along said path so as to maintain plasma characteristics substantially constant during scanning.

7. A magnetron sputtering source for depositing a material onto a substrate, comprising:

a target having a surface, spaced from the substrate, from which the material is sputtered;

a movable assembly comprising:

a magnet assembly disposed in proximity to said target for confining a plasma at the surface of said target; and an anode for producing electric fields in a region of said plasma; and a drive assembly for scanning said movable assembly along a prescribed linear path relative to said target.

8. A magnetron sputtering source as defined in claim 7 wherein said plasma comprises an elongated, closed-loop, racetrack-shaped plasma having a long dimension perpendicular to said linear path.

9. A magnetron sputtering source as defined in claim 8 wherein said anode is disposed between said target and the substrate and is mechanically coupled to said magnet assembly around opposite edges of said target.

10. A magnetron sputtering source as defined in claim 8 wherein said anode comprises elongated conductors disposed between said target and the substrate and spaced apart on opposite sides of said plasma.

11. A magnetron sputtering source as defined in claim 7 wherein said anode comprises a tube for circulating a cooling fluid.

12. A magnetron sputtering source as defined in claim 7 wherein said anode comprises a tube having perforations for delivering a process gas.

13. A magnetron sputtering source as defined in claim 12 further comprising a baffle structure disposed around said tube for directing the process gas delivered by said tube in a selected direction.

14. A magnetron sputtering source as defined in claim 7 wherein said movable assembly further comprises at least one process gas tube disposed between said target and the substrate and movable with said anode for delivering a process gas to the region of said plasma.

15. A magnetron sputtering source as defined in claim 14 further comprising a baffle structure disposed around said process gas tube for preferentially directing the process gas delivered by said process gas tube in a selected direction.

16. A magnetron sputtering source as defined in claim 7 wherein said anode remains in a fixed physical relationship with respect to said plasma as said movable assembly is scanned by said drive assembly and wherein said anode maintains substantially constant plasma characteristics.

* * * * *